United States Patent [19]

Mizuno et al.

[11] Patent Number: 5,357,473
[45] Date of Patent: Oct. 18, 1994

[54] SEMICONDUCTOR STORAGE SYSTEM INCLUDING DEFECTIVE BIT REPLACEMENT

[75] Inventors: Masahiro Mizuno; Takashi Fujita; Hiroshi Baba; Keizo Hama, all of Kanagawa, Japan

[73] Assignee: Mitsubishi Denki Kabushiki Kaisha, Tokyo, Japan

[21] Appl. No.: 132,768

[22] Filed: Oct. 6, 1993

Related U.S. Application Data

[63] Continuation of Ser. No. 718,015, Jun. 20, 1991, abandoned.

[30] Foreign Application Priority Data

Sep. 8, 1990 [JP] Japan .................. 2-211362

[51] Int. Cl.⁵ .......................................... G11C 13/00
[52] U.S. Cl. ................................. 365/201; 371/21.2
[58] Field of Search ........... 365/200, 201, 189.07; 371/21.1, 21.2

[56] References Cited

U.S. PATENT DOCUMENTS

| | | | |
|---|---|---|---|
| 4,223,382 | 9/1980 | Thorsrud | 364/200 |
| 4,414,665 | 11/1983 | Kimura et al. | 365/201 X |
| 4,541,090 | 9/1985 | Shriagasawa | 365/201 X |
| 4,730,320 | 3/1988 | Hidaka et al. | 371/38 |
| 4,903,268 | 2/1990 | Hidaka et al. | 371/40.1 |
| 4,943,966 | 7/1990 | Giunta et al. | 371/11.1 |

FOREIGN PATENT DOCUMENTS 63-793000 9/1988 Japan .

Primary Examiner—Steven Mottola
Attorney, Agent, or Firm—Wolf, Greenfield & Sacks

[57] ABSTRACT

A semiconductor storage system comprises a semiconductor storage element array including a plurality of semiconductor memory elements, a data bus for transferring data to said semiconductor storage element array, an address bus for inputting an address to said semiconductor storage element array, a read/write controller for controlling read/write of the data written to said semiconductor storage element array, an interface control module for controlling a transfer/receipt of data and commands to and from an outside system, a microprocessor for controlling said read/write controller and said interface control module, a defect address memory for storing and outputting information on an address where at least one defective bit exists and an alternate address to be substituted for said address, and a defect address manipulating circuit for substituting said alternate address for said address where said defective bit exists in accordance with an output of said defect address memory.

30 Claims, 8 Drawing Sheets

SEMICONDUCTOR STORAGE SYSTEM INCLUDING DEFECTIVE BIT REPLACEMENT

This application is a continuation-in-part, of application Ser. No. 07,718,015filed Jun. 20, 1991 now abandoned.

BACKGROUND OF THE INVENTION

The present invention is directed generally to a semiconductor storage system, and more particularly, to a semiconductor storage system capable of high-speed access, while avoiding read/write errors resulting from defects present in elements of a constituent semiconductor storage element array.

In recent years, semiconductor memory manufacturing technology has advanced. This advancement has made it possible to provide a semiconductor memory based storage module as an external storage system of a computer. External storage systems have hitherto comprised one or more fixed disk drives. Semiconductor memory based external storage systems are exemplified by RAMSTOR made by Western Automation Corp. in USA or disclosed in Japanese Patent Laid-Open No. 32420/1990 (Japanese Patent Application No. 181873/1988).

FIG. 1 is a schematic block diagram showing one example of the construction of such a conventional semiconductor storage system. Referring to FIG. 1, the numeral 1 represents a semiconductor storage element array; 2 a data bus; 3 a DRAM controller; 4 an address bus; 5 a DMA controller; 6 an I/F (interface) control module; 7 an ECC circuit; and 8 a microprocessor.

The operation thereof will hereinafter be described with reference to the accompanying drawings. A command given from a host computer 16, also called a host system, is input to the I/F control module 6 for controlling a transfer and receipt thereof. The command is thereafter decoded by the microprocessor 8 for controlling the DMA controller and the interface control module. The command is executed thereby. One important command is a data transfer command, and the data transfer is executed by the DMA controller 5. The microprocessor 8 calculates an actual data transfer start address and a data transfer quantity from a transfer data quantity and a transfer start logical address specified by the host system. The data transfer start address and the data transfer quantity are imparted to the DMA controller 5. If a defect occurs in the semiconductor storage element array 1, the defect is detected by self-diagnosis at the starting time. Calculations are effected to eliminate the defect.

The DRAM controller 3 controls data read/write timing. When reading the DRAM controller 3 reads data from the semiconductor storage element array 1 in which the data is stored. When writing, DRAM controller 3 gives a write timing signal. An address for read data or write data is given via the address bus 4. The read data or the write data is transmitted via the data bus 2. The ECC circuit 7 corrects the errors in the read or write data, and reading thereof is then effected. The ECC circuit 7 generates and adds error correction data to the writer data. The error correction data is written together with the write data.

Disclosed in Japanese Patent Laid-Open No. 32420/1990 (Japanese Patent Application No. 181873/1988) is a technique by which an interface between the outside and a semiconductor file device, i.e., a modulation/demodulation circuit incorporated into the system is compatible with the conventional magnetic disk drive. Based on this technique, the I/F control module 6, the ECC circuit 7 or a defect replacement function are entrusted to the controller itself for the magnetic disk.

However, this type of conventional semiconductor device constructed in the manner described above, presents a problem. It takes much time to replace deteriorated addresses and defective data by use of the ECC circuit 7, i.e., several tens of $\mu s$ are required. This produces a rate-determining factor, thereby probably causing a drop of data transfer rate to the host system. To avoid this drop, it is required to maintain, within the semiconductor storage system, a 1.5-fold higher internal transfer rate than external transfer rate between the host system and the semiconductor storage system. It is also required that an FIFO (first-in and first-out) buffer memory having a capacity as large as 1 MB be provided to properly perform the transfer between the outside and the inside at different transfer rates.

The following is a description of additional inconveniences incidental to the technique disclosed in Japanese Patent Laid-Open No. 32420/1990 (Japanese Patent Application No. 181873/1988). An interface identical to the interface of the conventional magnetic disk drive is employed. As a result, initialization is needed every time the power supply is turned ON to establish the replacement address. The initialization requires much time. Besides, a data area corresponding to a data gap of the magnetic disk becomes redundant. The replacement process is effected on a track or a sector unit basis. Thus the portions undergoing the replacement process are larger than the defect.

There arises a further problem incidental to the conventional device. When an error is produced during operation, a soft error restorable by the ECC circuit may, over time, become a hard error unrestorable by the ECC circuit. Such a defect in turn damages the data. Due to the reasons outlined above, the number of allowable defects for a single device is limited.

SUMMARY OF THE INVENTION

It is a primary object of the present invention, which has been devised in the light of the foregoing problems, to provide a semiconductor storage system capable of reducing the time required for processing defects.

It is another object of this invention to provide an inexpensive semiconductor storage system capable of employing a large number of inexpensive semiconductor storage elements containing many defective bits as a semiconductor storage element array.

It is still another object of this invention to provide a highly reliable semiconductor storage system capable of effecting a substitution of storage locations before an error caused during an operation develops into a hardware error.

To accomplish the foregoing objects, according to one aspect of the invention, there is provided a semiconductor storage system comprising: a semiconductor storage element array composed of a plurality of semiconductor memory elements, including one or more semiconductor memory elements containing one or more defective bits, for storing information; a data bus, consisting of a plurality of bits for transferring data to the semiconductor storage element array; a DRAM controller for controlling read/write of data written to the semiconductor storage element array; a DMA controller for controlling a data transfer by giving a start command to the DRAM controller and an address for read and writing to the semiconductor storage element array; an address bus, consisting of a plurality of bits for inputting an address to the semiconductor storage element array, the address being output from the DMA controller; an interface control module for controlling a transfer/receipt of the data and commands through a host computer and a magnetic disk interface; an ECC circuit for, in a reading operation, reading the data transferred from the semiconductor storage element array, detecting an error of data, correcting the error and inputting the data to the data bus, and for, in a writing operation, generating and adding ECC data (Error Checking and Correction code data) from the data transferred from the host computer; and a microprocessor for controlling the DMA controller and the interface control module, and the system further including a defect address memory for storing information regarding an address where at least one defective bit exists among addresses consisting of one or more bits and regarding a substitute address to be substituted for the address; and a defect address manipulating circuit for substituting the substitute address for the address where the defective bit exists in accordance with an output of the defect address memory.

The semiconductor storage system may further include: a defective bit memory for storing positional information of the defective bit existing at the address to be output; an alternative semiconductor storage element for providing alternative storage of the defective bit; and a defective data manipulating circuit for replacing an output from the defective bit with an output from the defect alternative semiconductor storage element in accordance with an output of the defective bit memory.

The semiconductor storage system may further include: a defective bit memory for storing positional information of the defective bit existing at the address to be output; an alternative semiconductor storage element for providing alternative storage of the defective bit; and a defective data manipulating circuit for replacing an output from the defective bit with an output from the alternative semiconductor storage element in accordance with an output of the defective bit memory.

In the semiconductor storage system, the defect address memory and the defective bit memory are composed of rewritable nonvolatile memories. When a data error is detected in the ECC circuit, the positional information of an address where the error is caused is written to the defect address memory. The positional information of the address and the positional information of a bit where the error is caused at an address where the error is produced are written to the defective bit memory.

In the semiconductor storage system, the defect address and the defective bit are detected before delivery. If detected, the positional information thereof is given beforehand to the defect address memory and the defective bit memory, respectively.

In the semiconductor storage system, when the defect address or the defective bit is detected during an operation, the positional information thereof is given respectively to the defect address memory and the defective bit memory and additionally registered in sequence.

The semiconductor storage system includes a counter for counting up the number of recoverable (i.e. correctable) errors detected in the ECC circuit. When counting the number of the recoverable errors a predetermined number of times at the same address, the address is replaced by another address.

The semiconductor storage system includes a serial port connectable to a personal computer or the like. Contents of the defect address memory and the defective bit memory are rewritable while on-line.

In the semiconductor storage system, external dimensions, mounting dimensions, connector dimensions and a control interface are the same as those of a conventionally used fixed disk drive.

According to another aspect of the invention, there is provided an information processing system constructed by connecting the present semiconductor storage system to a host computer.

According to still another aspect of the invention, there is provided a semiconductor storage system characterized in that: a defect address or a defective bit is detected by sequentially writing and reading predetermined test patterns at all addresses and by comparing the written test pattern with the read test pattern; and when the defect address or the defective bit is detected, identifying a type of the defect and substituting for the defect address or the defective bit in accordance with the type of defect.

Where the defect in the semiconductor storage element array is derived from a defect address, the defect address manipulating circuit replaces the defect address with another address previously stored in accordance with the output of the defect address memory. Where the defect is due to a defective bit, the defective data manipulating circuit replaces the defective data bit at the defect address with another data bit stored beforehand in the alternative semiconductor storage element in accordance with the output of the defective bit memory. The data is thus replaced.

The defects can be stored in the defect address memory and the defective bit memory which are composed of EEPROMs. The defects can be additionally stored in advance before delivery or during operation. The defects can be rewritten and stored also in on-line operation via the serial port provided in this system by use of the personal computer.

The errors recoverable by the ECC circuit are detected. The counter counts up a predetermined number of recoverable errors. In this case, the block including that address is duplicated in the separate free region. From that time onwards, when receiving an access command of this same block, the microprocessor automatically accesses a translation address of the substitute destination. At the same time, the contents of the defect address memory and the defective bit memory are updated together.

The external dimensions, mounting dimensions, connector dimensions and a control interface are the same as those of a conventionally used fixed disk drive.

The information processing system can be constructed by connecting the present semiconductor storage system to the host computer.

The defect address or the defective bit is detected by sequentially writing and reading predetermined test patterns at all the addresses and by comparing the written test pattern with the read test pattern. If the existence of the defect address or the defective bit is detected, and after identifying the type of defect affecting the defect address or the defective bit is identified, and the defect is substituted using a method corresponding to this type.

BRIEF DESCRIPTION OF THE DRAWINGS

Other objects and advantages of the present invention will become apparent during the following discussion taken in conjunction with the accompanying drawings, in which.

DETAILED DESCRIPTION OF THE PREFERRED EMBODIMENTS

Embodiments of this invention will be described with reference to the accompanying drawings.

Figure 1:
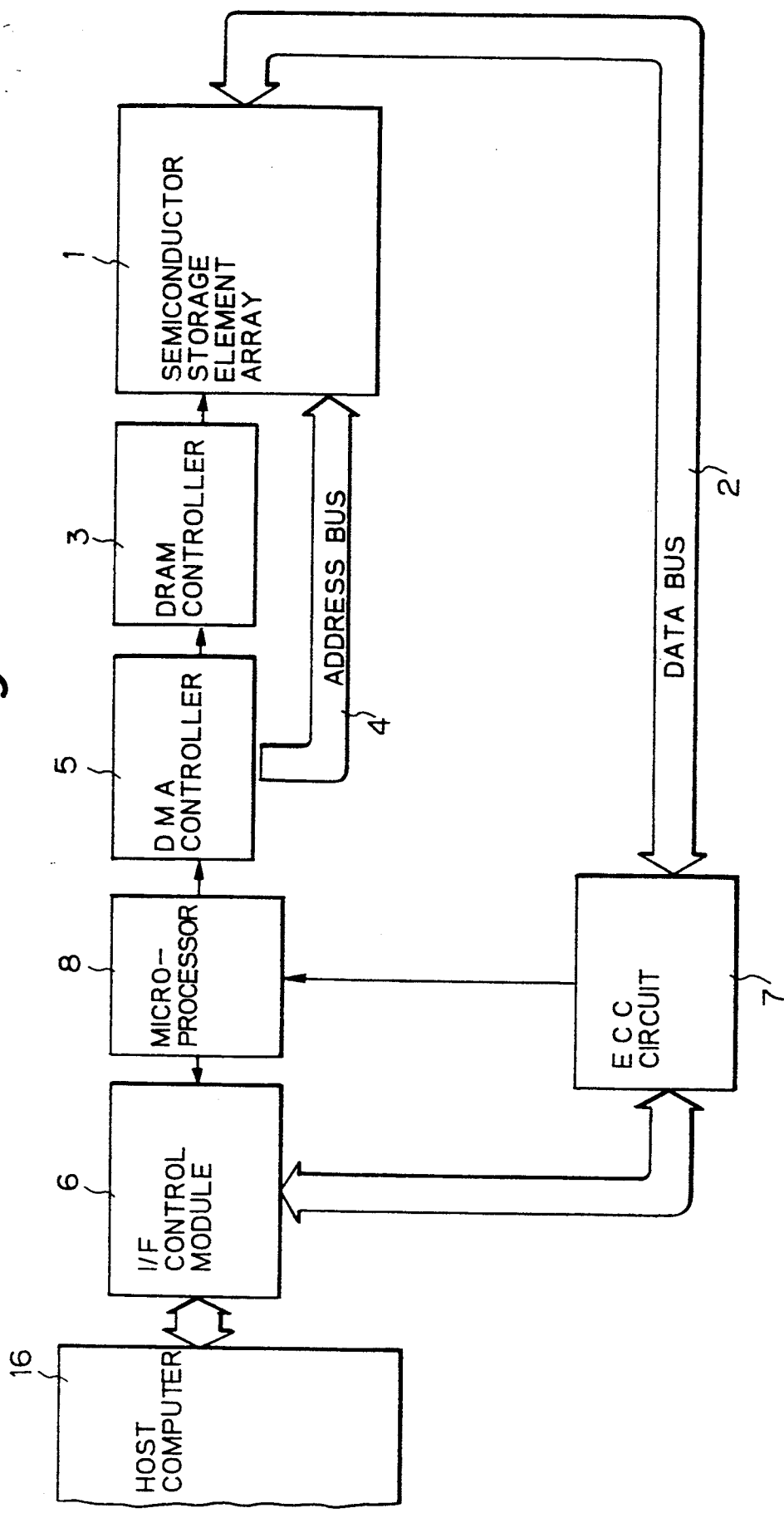
FIG. 1 is a schematic block diagram illustrating a conventional semiconductor storage system.
Figure 2:
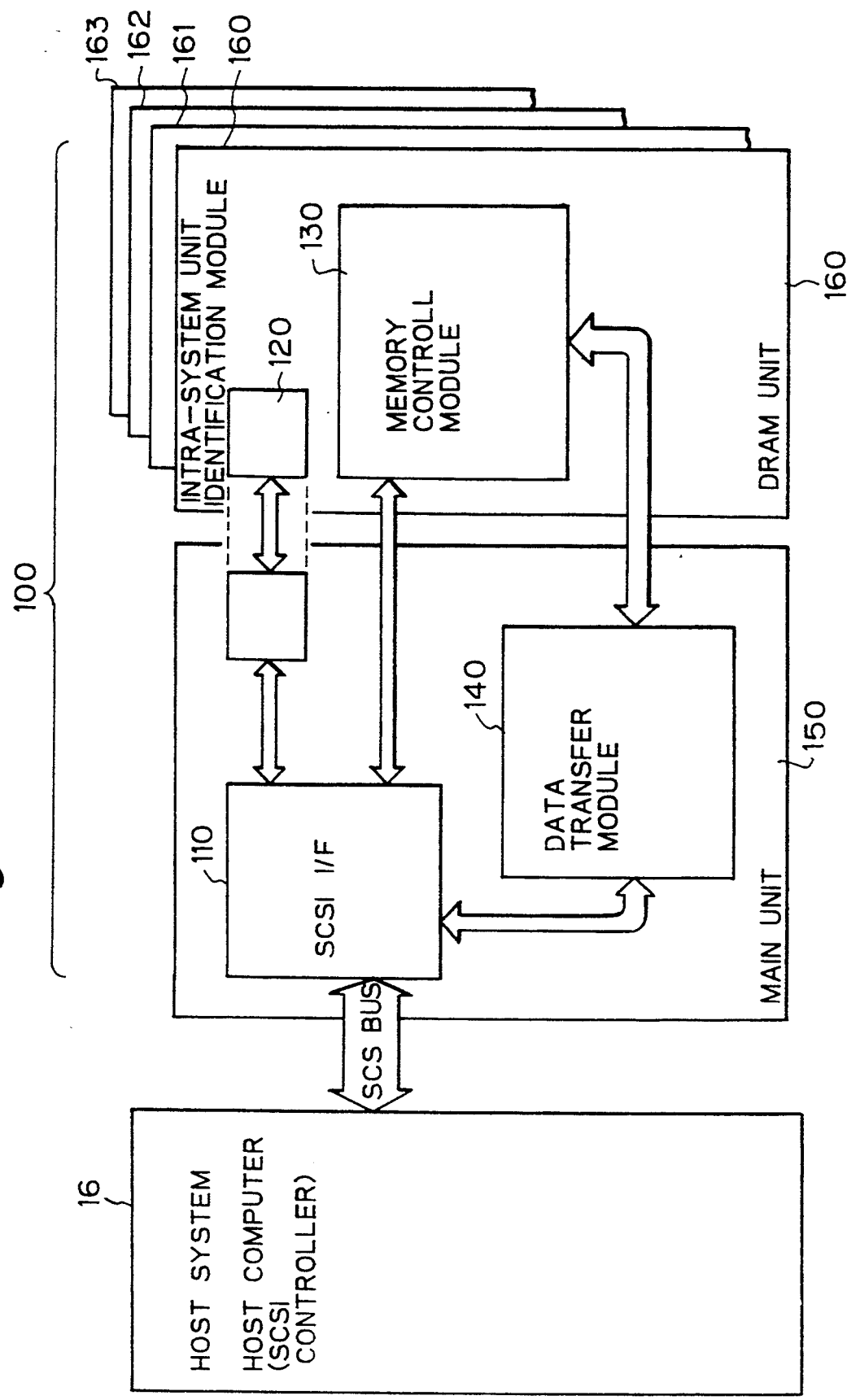
FIG. 2 is a block diagram depicting a whole configuration of a semiconductor storage system in one embodiment of this invention.

FIG. 2 is a block diagram showing a configuration of one embodiment.

Referring to FIG. 2, the numeral 100 designates a semiconductor storage system according to the present invention.

The numeral 110 denotes an SCSI I/F (Small Computer System Interface); 120 an intra-system unit identification module; 130 a memory control module; 140 a data transfer module; 150 a main unit; and 160-163 DRAM units. The respective components will be explained.

The SCSI I/F 110 is a module between the DRAM unit and a host computer 16, responsive to host computer messages. A response to a selection issued by the host via an SCSI bus, responses to decoded commands, messages and statuses and also selections are all processed based on exchanges between a microprocessor, which will be mentioned later, and SCSI chips.

The SCSI chips employed for the SCSI I/F 110 are a 16-bit bus version. Combined with the fact that a bus width of the microprocessor in this embodiment is 16 bits, a highly efficient transfer of a 2-byte width is attainable. As a result, the frequency of memory access is decreased, thereby reducing consumption of electric power.

This interface processes a command of the SCSI I/F using the following procedures.

When a selection of the SCSI I/F by the host system (SCSI controller) is made, command mode automatically becomes available. After receiving a command from the host system SCSI controller, an interruption is caused in the SCSI chips.

The SCSI chips read the contents of a buffer for receiving commands into the interface and decode the command. The operation (e.g., data transfer) starts based on the decoded contents.

Next, the intra-system unit identification module 120 automatically identifies the various units attached in arbitrary slot positions within the system.

The following is a description of how the intra-system unit identification is carried out. Intrinsic address numbers are given to respective slots of a mother board of the main unit 150. A 4-bit address number is sent to the DRAM unit 160 interposed therebetween.

Given to each DRAM unit is a 4-bit unit type indicating its type.

An address line and a unit type line are led from the microprocessor 8 to each DRAM unit. The unit of an address in which the address specified by the microprocessor 8 coincide with the address number transmits a unit type of its own via the unit type line.

The DRAM unit concerned is selected through the unit address line by utilizing the function described above after effecting a logical/physical conversion of an address (logical address to physical address conversion). An intra-unit page is specified through a page setting line. With this arrangement, a 32 MB memory space of the semiconductor storage element array is sectioned into 8 MB unit pages, and the control thereof is thus performed.

The number of pages per unit and the number of units per system are set in a table on the microprocessor 8 by a unit type address search when starting the system. The page number and the unit number are referred by the logical/physical conversion.

Even when the system is working, a unit packaging status is monitored. Hence, the units readily expand or contract in size.

Next, in the memory control module 130, RAS control, CAS control and refresh control are performed by control circuits (IC) associated with each 16 MB unit, thus providing a mapped I/O of a CPU.

Fundamental clocks are constantly given, whereby refreshing is performed at intervals of a constant time. Any future address expansion requires the provision of a data latch for expansion, and a page expansion per 8 MB is carried out.

Page setting involves the use of a unit address register (4-bit) in the main unit and a page setting register (4-bit) therein. A page within the DRAM unit is expandable to 16 pages, i.e., expandable to a 16 MB DRAM based DRAM unit.

The DRAM controller 3 carries out the memory control and refreshing as well. An 11-bit data latch is adopted as an address latch for setting the address of the semiconductor storage element array.

The DRAM controller 3 is disposed on each 16 MB memory unit (two controllers 3 for a 32 MB DRAM unit).

Refresh timing of each unit may be adjusted by modifying a reset release timing of each DRAM controller 3 within the system. Consumption of electric power is thereby reduced.

Next, the data transfer module 140 effects the data transfer associated with the read/write operations from and to the DRAM. The transfer is performed not via the CPU but directly between the SCSI controller and the DRAM by use of the DRAM controller 3 which will be described later.

The operation is classified into one of a write operation and a read operation.

The write operation is intended to write the write data from the host system to the DRAM. Data having a 1-byte width transmitted via the SCSI I/F is accumulated to 4 byte groups and concatonated with a 7-bit ECC. The 4-byte group plus 7-bit ECC is written to the DRAM as a 39-bit unit.

The read operation reads the data from the DRAM and transfers the data to the host system. The 39-bit data read from the DRAM is, after an error has been detected and corrected in the ECC circuit 7, transferred via the SCSI I/F to the host system.

A transfer request sent from the host system (SCSI controller) includes a logical block number of a constant length and the number of transfer blocks. This request is converted into an address space within the system. This is further converted into a transfer start address (relevant DRAM unit and relevant address within this unit) and the number of data transfer bytes. The transfer request is thus given to the DRAM.

This transfer is executed mainly by the microprocessor 8. The microprocessor 8 has the following characteristics.

The microprocessor 8 includes an internal 32-bit/16-bit bus, and data transfer efficiency is thereby enhanced.

The operation can be performed with a low consumption of electric power by using a sleep mode and a stop mode.

The operation described so far is a DMA transfer. When effecting a comparison between the data, a programmed transfer is carried out. An inter-memory data transfer is effected by using the program without using the DMA. This is used for a bypass operation when an error is indicated by the ECC circuit 7.

Figure 3:
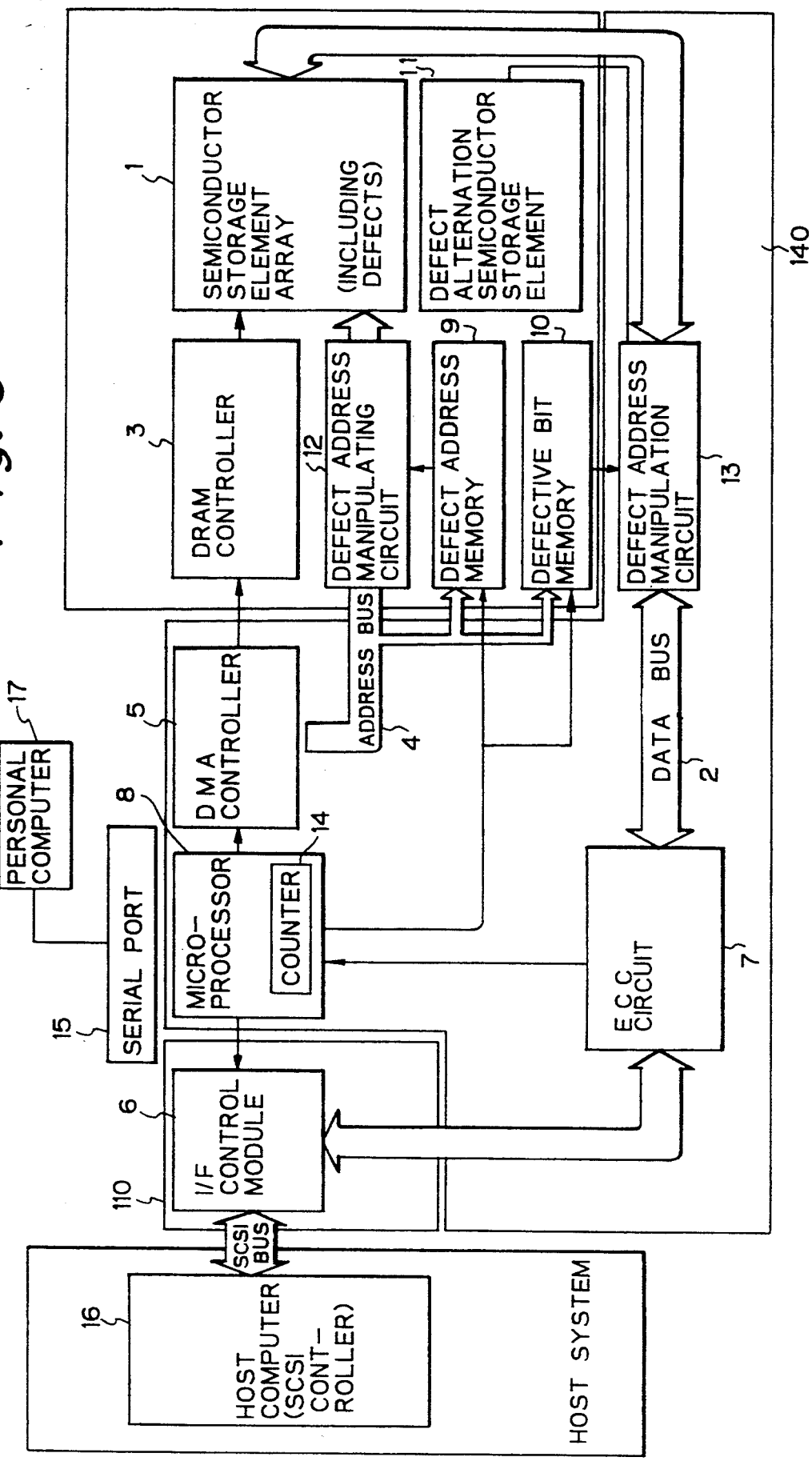
FIG. 3 is a block diagram illustrating the semiconductor storage system.

FIG. 3 is a block diagram showing this embodiment.

A semiconductor storage element array 1 contains more than one defective bits. The DRAM controller 3 is conceived as a control module for controlling read/write of the data thereof. An address bus 4 composed of a plurality of bits serves to impart a start command to the DRAM controller, provides an address for reading and writing to the semiconductor storage element array and transmits the address from a DMA controller 5 for controlling the data transfer to the semiconductor storage element array 1. A data bus 2 composed of a plurality of bits serves to transmit the data to the semiconductor storage element array 1 from the ECC circuit 7 for detecting and correcting a data error. The microprocessor 8 is a central processing unit for controlling the DMA controller 5, the ECC circuit 7 and the I/F control module 6. A defect address memory 9 is a memory for imparting the information on defective and substitute addresses stored therein to a defect address manipulation circuit 12 interposed in the address bus 4. A defective bit memory 10 is a memory for imparting the information on defective and substitute data stored therein to a defective data manipulation circuit 13 interposed in the data bus 2. An alternative semiconductor storage element 11 is an element for storing the data which is substituted for the defective bits of the semiconductor storage element array 1. A counter 14 counts errors reported by the software. A serial port 15 may connect an external personal computer 17 to the microprocessor 8. A host computer 16 is connected via an interface to the main system. An I/F control module 6 controls the transfer/receipt of the data and commands.

The following is a description of the operation of the embodiment.

Commands issued from the host computer, also called a host system, are input to the I/F control module 6 for controlling the transfer/receipt of data. The commands are thereafter decoded by the microprocessor 8 for controlling the DMA controller 5 and the I/F control module 6. Transfer commands are dominant. The data transfer is executed by the DMA controller 5 as well as by the ECC circuit 7. The microprocessor 8 calculates an actual data transfer start address and data transfer quantity from the data transfer start logical address and transfer data quantity which are indicated by the host system. The calculated results are imparted to the DMA controller 5.

The DRAM controller 3 controls timings at which the data are read and written. The DRAM controller 3 transmits data read/write timing signals to the semiconductor storage element array 1 in which the data are stored. The address for the read data or the write data at that time is given through the address bus 4. The read data or the write data is transmitted via the data bus 2.

Figure 4:
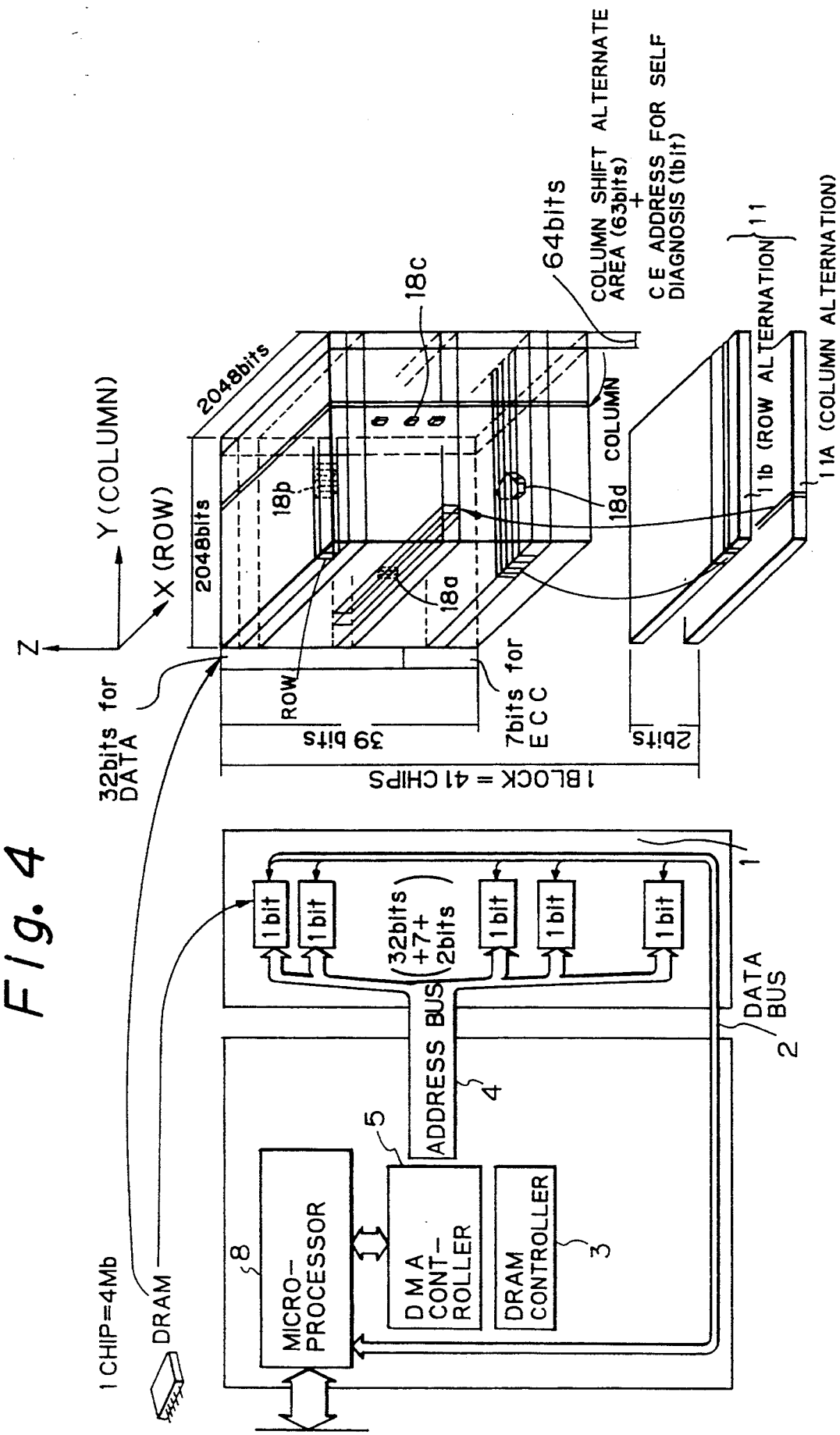
FIG. 4 is a diagram showing a semiconductor storage element array and attributes of defective bits.

FIG. 4 is a diagram showing the semiconductor storage element array and attributes of the defective bits.

As illustrated in FIG. 4, a memory space of the semiconductor storage element array 1 is three-dimensionally expressed by axes X, Y and Z. The X-axis represents ROW, while the Y-axis represents COLUMN.

Thirty two planes of semiconductor storage element array 1 are provided for storing the data. Seven planes of element array 1 are provided for ECC of the data. Additionally, each block incorporates two 4 Mb DRAMs referred to as alternative semiconductor storage element 11 for data substitution. Two such blocks are packaged in 1 DRAM unit. A single plane of alternative semiconductor storage element 11 is employed for ROW substitution. Another single plane of alternative semiconductor storage element 11 is used for COLUMN substitution.

The address space consists of 2048 ROWs×(1984+63+1) COLUMNs. Sixty-three columns represents a COLUMN shift substitute area, and the remaining column 1 is employed as a CE address for self-diagnosis.

A defect substitution method will next be explained.

The defect substitution is a technique of effecting read and write operations, while steering clear of defective bits existing in the DRAM. This technique is the key for attaining an inexpensive and highly reliable system capable of employing a DRAM in which defects probably exist.

To attain this system, the following measures are taken in this embodiment.

An error may be detected during execution of a data transfer command while in a self-diagnosis made at the starting time, while in the system working state and while in the production process. From the time at which an error is detected onwards, a defective address is physically substituted with a good address so as not to access the defective address or in the case of a defective data bit replacing the defective data line. The defect information indicating when substitution of the defect occurs is managed on the DRAM unit. Hence, an EEPROM (8K×8 bits) is included as a defective bit memory 10 on DRAM unit 160.

The defects are classified into the following four types.

The memory space in this system is configured by stacking 39 pieces of 4 Mb DRAMs as 39 planes. It is assumed that defects exist in this memory space. A point type defect 18a is one whose address is not contiguous with other defects. An XY type defect 18b is one whose address is part of a contiguous group of defective addresses extending in the ROW or COLUMN direction within the single piece of DRAM. A Z type defect 18c is one whose defects exist at the same address of the plurality of DRAMs. A pool type defect 18d is one whose address is contiguous with other defects in the ROW and COLUMN directions within the single piece of DRAM.

The following two types of defect substitution methods are employed in combination to efficiently process the four kinds of defects.

One of the methods is a data substitution. This aims at substituting the defective portion with data of the alternative memory.

An alternative memory for defect substitution is provided. In the data at the address where the defect exists, the data of the defective bits is replaced with the data of the alternative memory for defect substitution.

To reduce the amount of memory needed for storing the defective positions, the substitution is effected on ROW and COLUMN units. Two pieces of DRAM (each having no defect), one for ROW substitution and one for COLUMN substitution are required.

Information is stored in the defective bit memory 10 in the DRAM unit 160 to output the number of a bit where a defect exists at the defect address (ROW or COLUMN).

A sector of the data line is changed over in response to the defective bit memory output. At the defect address (ROW or COLUMN), a defective bit output is replaced with an output of the alternative memory DRAM for defect substitution.

Figure 6:
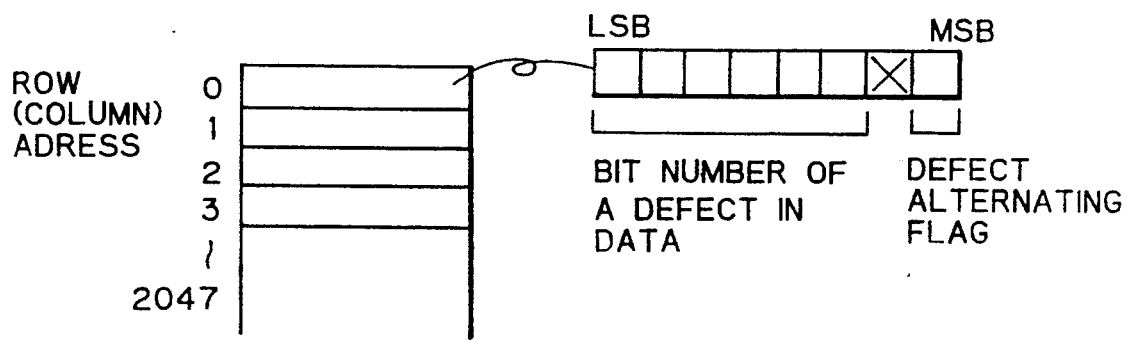
FIGS. 6 and 7 are diagrams each illustrating an internal format of an EEPROM.

The defective bit memory 10 is, hereinafter explained in detail, divided into a ROW memory and a COLUMN memory. These memories are, as illustrated in FIG. 6, supplied with the same addresses as the DRAM. In the contents stored, the low-order 6 bits indicate the number of the bit to be substituted at that address, while MSB indicates a substitute flag. Supposing, for example, that a defective bit such as 18a exists in the fifth column of the third DRAM from the upper part of the memory array. Then the contents of address 5 of COLUMN substitute EEPROM 10b with respect to COLUMN alternate storage element 11a are given by 110000×1. This implies that the third DRAM, corresponding to the third bit from above, is to be substituted.

A second substitute method is a shift substitution. The shift substitution translates the address to steer clear of the defective address.

When a column where a defect exists is specified to the EEPROM in the DRAM unit, the address specified by a defect address manipulating circuit 12 is a modified version of the defective address, i.e., an adder placed on the column address line, by means of which a constant sufficient to shift the column address to avoid that portion is added to the defective address.

In general, the EEPROM has a long access time (150–250 ns). Therefore, the contents of the EEPROM 10a are employed after being temporarily loaded into an SRAM.

A given address of the SRAM is the same as the column address of the DRAM. An address shift quantity stored at that address in the SRAM is, as illustrated in FIG, 6, stored by low-order 6 bits.

If isolated three-dimensionally as in the defective bit 18a, and in the case of one-dimensionally contiguous defects, such as 18b the data bits are substituted (data substitution). In the case of expanding two-dimensionally contiguous defects, such as 18c and 18d, it is appropriate to substitute the address (shift substitution).

The following is a description of substitution procedures depending on the time when the defect is detected.

The defect is classified into the following three types according to the time when the defect is detected.

(1) The defect is found out by a memory check before being delivered.
(2) The defect is found out when starting the system.
(3) The defect is found out during operation of the system.

The defect of type (1) is detected while comparing the write data with the read data in combination with variations in ambient conditions such as a voltage and a temperature.

The defect of type (2) is detected by writing and reading the data to and from the whole memory space during a period from 30 seconds to one minute after turning ON the system power supply. After the defect has been detected, substitution processing is carried out, and READY is output.

The detected defects (1) and (2) are so processed as to be encoded for substitution in the defect address memory 9 and the defective bit memory 10.

Defect processing information is accumulated every time a defect is found out.

In the case of (1), the substitution is effected beforehand on DRAM unit 160 at an ETF (Error Test Format) stage during the production process.

Even in the case of (3), the same processes as those of (1) and (2) are eventually executed. However, the working data is not actually lost, because the following procedures are taken.

If errors recoverable by the ECC circuit 7 are detected, the microprocessor 8 counts the recoverable errors at the same address. There exists a probability that if a plurality of errors are corrected at the same address, the errors will eventually develop into irrecoverable errors. Therefore, a predetermined number of errors are counted at an address, after which the block containing that address is temporarily duplicated in a separate free region.

When receiving an access command of this block from that time onwards, the microprocessor 8 uses a translation address and automatically accesses the temporary substituted address.

At the same time, the substitution process is, as in the case of (1) and (2), effected also at this defect address.

However, the defect substitution is carried out on the ROW or COLUMN unit. It is therefore required that the substitution process be effected after performing the temporary duplication so as not to spoil other necessary data.

Therefore, when turning ON again the power supply, the translation address information of the microprocessor has disappeared. The contents of the defect memory have, however, been updated. Hence, the address at which the soft error (not hard error) took place a plurality of times has already been substituted, and, once again, no accessing is effected.

Functions for production and maintenance are retained, such as forcing substitution from outside issuing a command to fetch the defect substitution information to outside.

Besides, the system provided with a serial port 15 is connectable via this port 15 to a personal computer 17. It is possible to rewrite the defect address memory 9 and the defective bit memory 10 via this serial port 15. The system is capable of performing the above function even while performing on-line data storage operation. For this reason, if an address exhibiting a high error frequency on the system is known, the defect substitution can be forcibly executed, via the serial port 15 without stopping the system.

A configuration having defects substituted is such that the contents of the defective bit memory 10 can be read. It is feasible to examine situations of defect substitution at the time of delivery and operation.

The procedures for deciding which substitution method to be applied to the object for substitution at the defect substitution time are selected considering both the test method of the DRAM which uncovered the defect and the kind of defect.

According to the present invention, the defect is substituted in the following manner.

If an error unrecoverable by the ECC circuit 7 is detected during an execution of data transfer command via the I/F control module 6 by the host computer 16, the address is physically substituted (shift substitution) so as not to access the defect address from this time onwards. Alternatively, the defective bit data is replaced (data substitution).

The following is an explanation of the operation when determining the presence and kind of defect in advance of substituting the defect.

A diagnosis program for finding out a defect at the time of delivery or system actuation runs in the system. This diagnosis program acts to check whether or not the respective bits of the semiconductor element array 1 are capable of reading and writing correctly based on a predetermined algorithm. For instance, the predetermined algorithm is capable of judging whether the respective bits are normal or not by making a comparison after writing a predetermined data pattern to the semiconductor element array 1 and reading again the pattern therefrom. The individual bits are thus examined, thereby knowing where the defective bits exist. As a result, a map of the defective bits is prepared. After the defective bit map has been prepared, there is made a judgment to define the type of defect from the point type defect 18a, the XY type defect 18b, the Z type defect 18c and the pool type defect 18d. If the defective bits are not contiguous in one or more of the three-dimensional directions, the defect is judged as the point type defect. if two or more defective bits are contiguous in the ROW (X) direction or the COLUMN (Y) direction, the defect is judged as the XY type defect. If a plurality of defective bits exist in the Z direction (i.e., at the same address), the defect is judged as the Z type defect. If defective bits exist both in the ROW (X) direction and in the COLUMN (Y) direction, the defect is judged as the pool type defect.

The operations of detecting the existences of the defect address and bits and identifying the types thereof will be explained with reference to FIG. 9.

Figure 9:
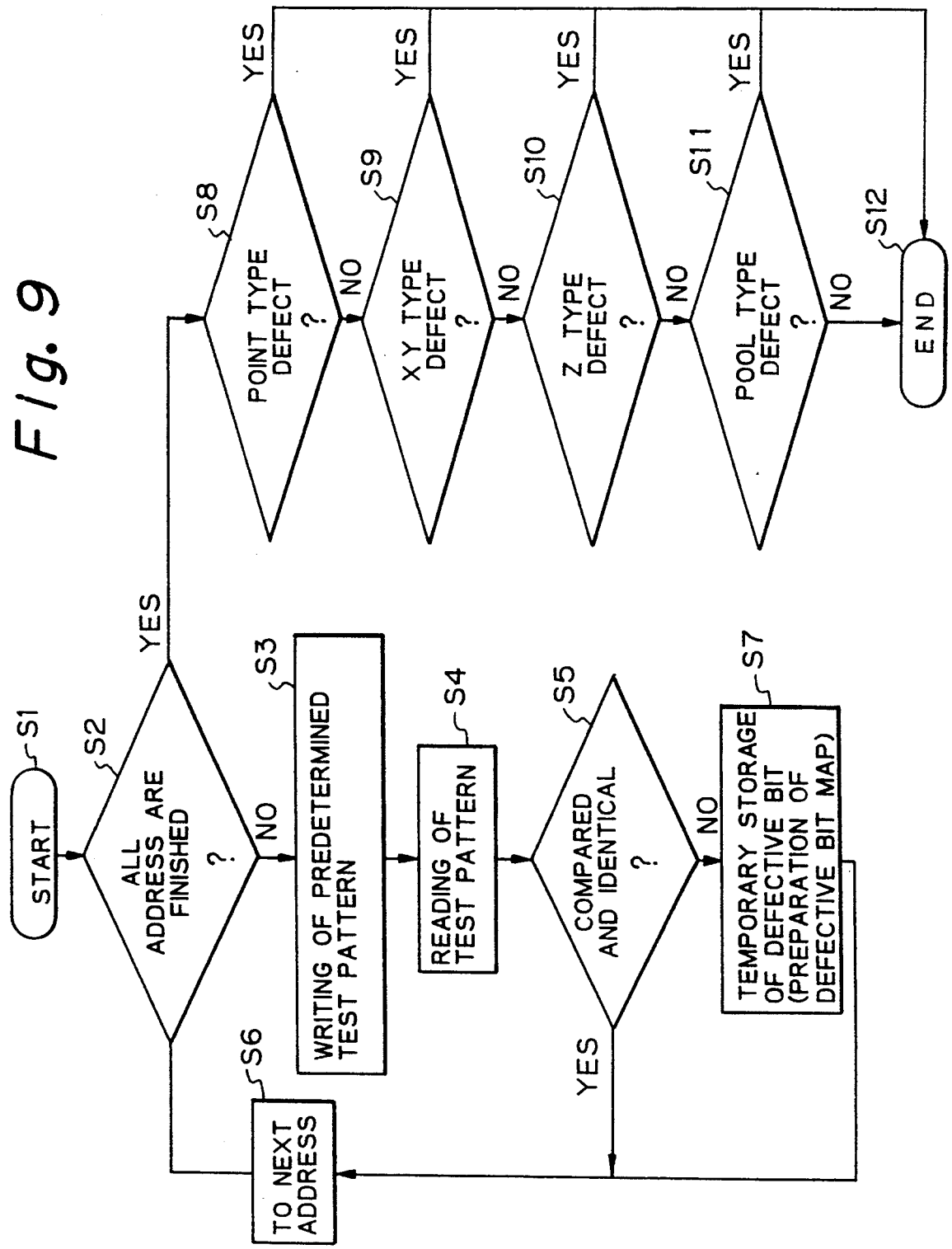
FIG. 9 is a flow chart.

FIG. 9 is a flow chart for detecting and identifying the defects.

The operation starts at a step S1.

At a step S2, a predetermined test pattern is written to the present system and stored therein with respect to all the addresses. Subsequently, the test pattern is read based on the stored data. The thus read test pattern is compared with the predetermined test pattern written thereto. Whether everything has been finished or not is determined. If finished, the operation moves to a step S8.

If not finished, the operation moves to a step S3 where the predetermined test pattern is written. The operation moves next to a step S4 where the predetermined test pattern is read. The operation then moves to a step S5.

At a step S5, the comparison with the predetermined test pattern is made. If identical, the operation shifts to a step S6 where a predetermined test pattern is written with respect to the next address. The operation returns to the step S2 for reading and making a comparison.

The test pattern read at the step S5 is compared with the predetermined test pattern written. If not identical, the operation moves to a step S7.

The defective bits are temporarily stored at the step S7. A defective bit map is prepared, and the operation moves to the step S6. The operation then returns to the step S2 for sequentially effecting write/read and comparison of the predetermined test pattern with respect to the next address.

At a step S8, when finishing the above-described comparisons with respect to the whole addresses, there is taken action to see whether the defective bit existing in the defective bit map is a point type defect or not. If the defective bit is classified as a point type defect, and no other type of defective bits exist, the operation moves to a step S12 and then comes to an end. The operation is the same when no defective bit exists in the defective bit map from the beginning. If the defective bit is not the point type defect, the operation moves to a step S9.

At the step S9, an action to see whether or not the defective bit is classified as an XY type defect is taken. If the defective bit is an XY type defect, and no other type of defective bits exist, the operation moves to a step S12. Whereas if the defective bit is not the XY type defect, the operation moves to a step S10.

At the step S10, whether the defective bit is the Z type defect or not is examined. If the defective bit is the Z type defect, and there are no other types of defective bits, the operation advances to a step S12. Then, the operation is terminated. Whereas if the defective bit is not the Z type defect, the operation moves to a step S11.

At the step S11, whether the defective bit is a pool-type defect or not is examined. If the defective bit is a pool type defect, and there are not other types of defective bits, the operation moves to the step S12. Then, the operation comes to an end. Whereas if the defective bit is not a pool type defect, the operation moves to the step S12 and comes to an end, as it has already been determined that there are no other types of defective bits.

Figure 5:
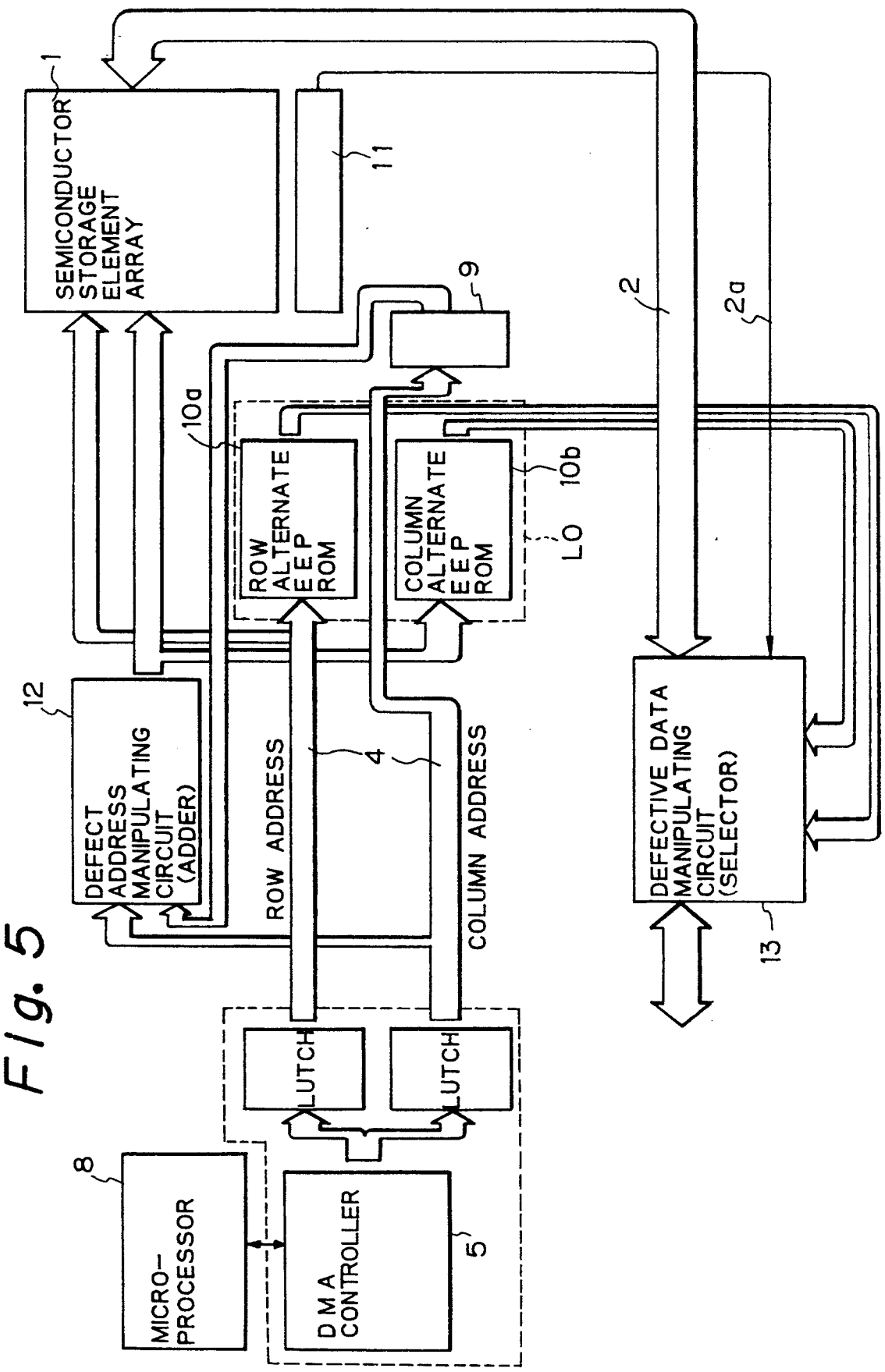
FIG. 5 is a schematic circuit diagram.

A bit position of the defective bits which has thus been judged as a point type defect or an XY type defect, is stored in the defective bit memory 10 as a result of effecting the bit substitution. In the case of a Z type defect, an address is stored in the defect address memory 9 as a result of effecting the address substitution. In the case of a pool type defect, either bit substitution or address substitution may be carried out. However, FIG. 4 shows bit substitution. Note that the defective bit memory 10 is, as illustrated in FIG. 5, consists of a ROW substitute EEPROM 10a and a COLUMN substitute EEPROM 10b. If a defective bit exists in the ROW (X) direction, the bit position is stored in the ROW substitute EEPROM 10a. If a defective bits exists in the COLUMN (Y) direction, the bit position is stored in the COLUMN substitute EEPROM 10b. In the case of the point type defect or the pool type defect, both of the EEPROMs are available.

FIG. 6 is a diagram showing an internal format of the COLUMN or ROW substitute EEPROM. The address (ADRS) ranges from 0 to 2047. Each address is composed of 8 bits. The addresses show one-to-one correspondence to the addresses of the semiconductor storage element array. Six bits out of 8 are employed for indicating a defective bit position in 32 bits specified by the address. Stored in one bit is a flag indicating whether those 6 bits are effective or not, i.e., whether the defect substitution is performed or not. If the 16th bit of the ROW address 100 is to be diagnosed as the point type defect by the diagnosis program. Based on this assumption, when registering this in the ROW substitute EEPROM 10a, the address 100 of the ROW substitute EEPROM 10b becomes as follows:

$$LSB \longleftrightarrow MSB$$
address 100　0　0　0　0　1　0　x　1

The 100th ROW of the ROW substitute portion 11b of the semiconductor storage element 11 is the ROW to be substituted.

Figure 7:
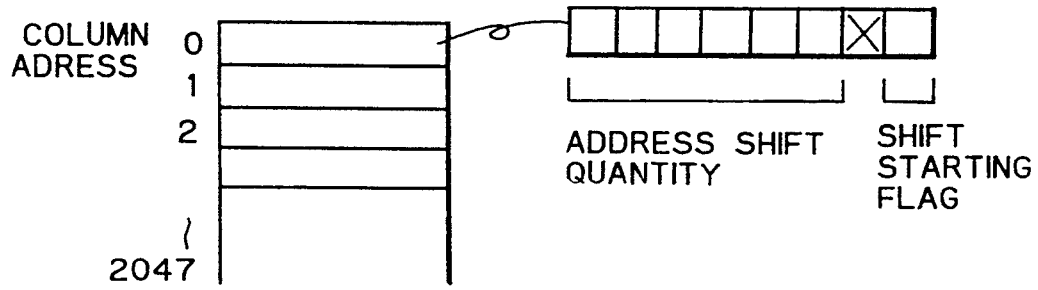

Next, a format of the defect address memory 9 will be described with reference to FIG. 7. The address is substituted by effecting a shift in the COLUMN direction. For this purpose, a COLUMN shift substitution area is provided, and a maximum of up to 63 addresses can be substituted.

As illustrated in the Figure, the COLUMN address (ADRS) ranges from 0 to 2047. Each address is composed of 8 bits. A shift quantity of the address is put in 6 bits among 8 bits. A flag informing that shifting is to be effected is stored in one bit. For example, if it is judged that a COLUMN address 100 and COLUMN address 102 include defects, the addresses in the neighborhood of the address 100 of the defect address memory 9 are given as follows:

| | |
|---|---|
| 99 | 0 0 0 0 0 0 × 0 |
| 100 | 1 0 0 0 0 0 × 1 ← |
| 101 | 0 1 0 0 0 0 × 1 |
| 102 | 0 1 0 0 0 0 × 1 ← |
| 103 | 0 1 0 0 0 0 × 1 |

Namely, for the n-th defect, the value n is stored in an address which precedes the defective address by n−1.

With this arrangement, when accessing the address 100, the shift quantity is actually added, and it follows that an address 101 is accessed. Similarly, in the case of the address 101, an address 103 is accessed. When accessing an address 102, it follows that an address 104 is in fact accessed. The addresses 100 and 102 are exclusive of accessing.

Next, there is will be made an explanation of how the address substitution is automatically performed at the actual accessing time.

To start with, an address to be accessed is given from the microprocessor 8 to the DMA controller 5. The DMA controller 5 gives an instruction of the substitute address to the defect address manipulating circuit 12 on the basis of the defect address information already stored in the defect address memory 9. The defect address manipulating circuit 12 substitutes the substitute address stored in the defect address memory 9 for the defect address.

As illustrated in FIG. 5, the defect address manipulating circuit 12 incorporates an adder constructed therein. The defect address memory 9 outputs a shift number by which the address is shifted. If the defective bits exist at, e.g., the addresses 100 and 200, 1 is output at the addresses 100 through 198. At the addresses from 199 onwards, 2 is output. Given to the semiconductor storage element array 1 are addresses obtained by the adder adding the number of address shifts to the address given by the DMA controller 5. With this arrangement, the address can be set to steer clear of the defective bits.

Next, the substitution of the defective bit at the defect address will be explained. Stored in the defective bit memory 10 is the information on positions of defective data bits at the defect addresses. In this defective bit memory 10, the addresses are allocated in the same manner with the semiconductor storage element array 1. To be specific, the ROW-directional addresses of the semiconductor storage element array 1 are at the same time continuous to the ROW-directional addresses of the ROW substitute semiconductor storage element. When specifying X=100 of the semiconductor storage element array 1, the data of X=100 of the ROW substitute semiconductor storage element is simultaneously selected.

The substitute data stored in the defect substitute semiconductor storage element 11 is input via a data bus 2a to a defective data manipulating circuit 13. At this time, the defective data manipulating circuit 13 functions as a selector. If it is judged that the ROW or COLUMN concerned is defective in the defective bit memory 10, the defective data output from the semiconductor storage element array 1 is discarded within the defective data manipulating circuit 13. Instead, the substitute data is selected from the defect substitute semiconductor storage element 11 and then output.

The defective bit memory 10 receives the data transfer, wherein the addresses are given respectively to ROW and COLUMN from the DMA controller 5.

The defective data manipulating circuit 13 is constructed as a selector. The defective data manipulating circuit 13 does not permit transmission of the defective data output from the semiconductor storage element array 1. This circuit 13 admits the transmission of only the normal data. The defective bit memory 10 outputs defective bit positions at the defect addresses. By this operation, the defective data manipulating circuit 13 replaces the defective data existing in the semiconductor storage element array 1 with the correct substitute data existing in the defect substitute semiconductor storage element 11.

Figure 8:
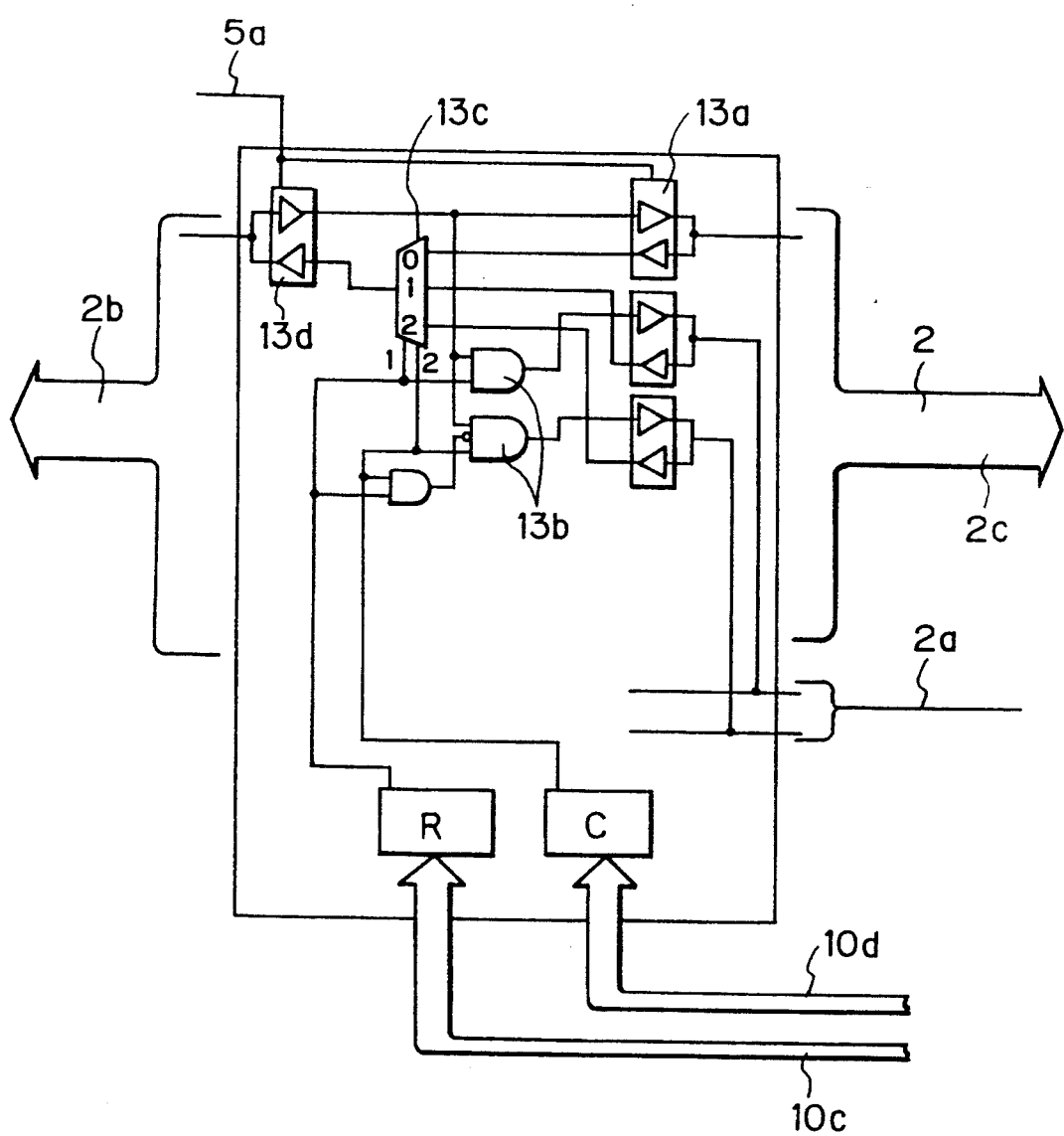
FIG. 8 is a circuit diagram showing a defective data manipulation circuit.

Next, the defective data manipulating circuit 13 will be described referring to FIG. 8. FIG. 8 is a circuit diagram depicting the defective data manipulating circuit 13.

In the defective data manipulating circuit 13, one portion 2b of the data bus 2 leading to the ECC circuit 7 is connected to the other portion 2c of the data bus 2. A data bus 2a is separately connected to the defect substitute semiconductor storage element 11. The data is transferred via the defective data manipulating circuit 13. The information on the defective bits is input from the defective bit memory 10 to ROW and COLUMN, respectively. In the defective data manipulating circuit 13, the data transfer is controlled by the DMA controller 5.

The data is input via the one portion 2b of the data bus 2 leading to the ECC circuit 7 to the defective data manipulation circuit 13. In this case, when the data is normal, i.e., the data contains no defect, the data is input to a buffer circuit 13 in the defective data manipulating circuit 13 and output via this circuit 13a. The data is transferred via the other portion 2c of the data bus 2 to the semiconductor storage element array 1.

At this time, if the data contains defects both in ROW and COLUMN of the semiconductor storage element array 1, the data is input to an AND circuit 13b together with inputting of the defective bit information from the defective bit memory 10. The data is output via the AND circuit 13b to the separately connected data bus 2a and transferred to the defect substitute semiconductor storage element 11.

When transferring the data from the semiconductor storage element array 1 to the ECC circuit 7, the data is input via the other portion 2c of the data bus 2 to the defective data manipulating circuit 13. If the data is normal, the data passes through a multiplexer 13c and is transferred via a buffer circuit 13d from the one portion 2b of the data bus 2 to the ECC circuit 7. Whereas if the data is not normal, the data is input to the multiplexer 13c together with outputting of the defective bit information from the defective bit memory 10 but is not transferred to the ECC circuit 7.

When the data is transferred from the defect substitute semiconductor storage element 11 to the ECC circuit 7, the data is input via the separate data bus 2a to the defective data manipulating circuit 13. Subsequently, the data is transferred via the multiplexer 13c and the buffer circuit 13d from the one portion 2b of the data bus 2 to the ECC circuit 7.

Either the address substitution or the data replacement may be effected. If one defect address contains one defective bit, the data bit is replaced. If the defect address contains a plurality of defective bits, the address is substituted.

Note that the substitute addresses and the substitute data bits are written to and stored in the defect address memory 9 and the defective bit memory 10 which are composed of rewritable nonvolatile memories.

Since the defect address memory 9 and the defective bit memory 10 are constructed of the rewritable nonvolatile memories, the contents thereof are updated and accumulated every time an error is detected.

Preventive maintenance will next be explained.

If the errors recoverable by the ECC circuit 7 are detected, the counter 14 incorporated into the microprocessor 8 counts up the recoverable errors. When counting up a predetermined number of recoverable errors on the same address, a block including that address is moved into a free region of an unused separate rewritable nonvolatile memory. There is a large probability that those recoverable errors will eventually develop into irrecoverable errors. In the case of receiving an access command of this block from that time onwards, the microprocessor 8 has already stored the translation address and therefore automatically accesses the substitute address.

The information on this address position is written to the defect address memory 9 through the DMA controller 5 and the address bus 4 as well when turning ON the power supply later. Likewise the information on an error occurrence bit position thereof is written to the defective bit memory 10.

Hence, after the next operation of turning ON the power supply, the address at which the error took place a predetermined number of times has already been substituted. Therefore, no accessing is carried out.

Looking from the I/F control module 6 for performing the communications with the host computer 16 serving as the host system, the DMA controller 5 for transferring the data to the I/F control module 6 and the microprocessor 8 for controlling these components, the control can be executed as if handling the semiconductor storage element array 1 with no defect in accordance with this embodiment. Therefore, where the actual data transfer start address on the system is calculated from the logic address given by the host system, almost no time is required for the defect avoiding process.

The system in this embodiment detects the defective addresses and bits by testing before delivery of the data. The positional information thereof is imparted beforehand to the defect address memory as well as to the defective bit memory. The substitutions of all the defects are completed therein, and those defects are not accessed from that time onwards.

If defects are newly caused or found out, however, the defects are processed in the following manner.

The defect avoiding process is performed also by the self-diagnosis when starting the system. During the test before delivering the system, the defect addresses and bits are completely substituted in advance with the substitute addresses and bits. The defects, which happen thereafter, are cumulatively stored in the nonvolatile memory. As a result, a quantity of the defects to be processed during the self-diagnosis is extremely small.

In this system, whenever the defect addresses and bits detected during the operation are detected, the contents thereof are stored and accumulated in the defect address memory 9 and the defective bit memory 10.

This system is provided with the serial port 15 and connected to a personal computer or the like. The positions of defect addresses and bits are storable in the defect address memory 9 and the defective bit memory 10 from outside via the serial port 15. This process can be executed even when the system assumes the on-line status.

External dimensions, mounting method, connector dimensions and control interfaces of the system in this embodiment may be the same as those of a conventionally used fixed disk drive.

The semiconductor storage system in this embodiment may be configured for connection to a variety of host computers 16.

Where the defect in the semiconductor storage element array 1 is derived from a defect address, the defect address manipulating circuit 12 substitutes the defect address with another address previously stored in accordance with the output of the defect address memory 9. Where the defect is due to a defective bit, the defective data manipulating circuit 13 replaces the defective data bits at the defect address with another data bit stored beforehand in the defect substitute semiconductor storage element 11 in accordance with the output of the defective bit memory 10. The data is thus substituted. It is therefore unnecessary to secure a large memory region which would exhibit poor performance. Looking from the I/F control module, the DMA controller for transferring the data and the microprocessor for controlling these components, control can be executed as if handling a semiconductor storage element array having no defect. The logical address is given by the host system. The actual data transfer start address is calculated from the logic address in the system. In this case, almost no time is needed for the defect avoiding process. Even if the semiconductor elements constituting the semiconductor storage element array contain a considerable number of deteriorated bits, a highly reliable semiconductor storage system can be constructed. The defects are stored in the defect address memory 9 and the defective bit memory 10 which are composed of EEPROMs. The defects are additionally stored in advance before the delivery or during the operation. The defects can be rewritten and stored also in the on-line via the serial port by use of the personal computer. As a result, time can be saved. Namely, according to this system, the defect addresses and bits are detected during the test before the delivery. The positional information thereof is imparted beforehand to the defect address memory 9 and the defective bit memory 10. The contents thereof are always updated and accumulated. Consequently, the number of defects to be processed during the self-diagnosis effected at each start is small, and the starting time is also short.

The system provided with the serial port 15 is connected via this serial port to the personal computer. Rewriting of the defective memory may be carried out thereby. Rewriting is also executable even when the system is in the on-line status. Hence, if it becomes obvious that there exists an address exhibiting a high frequency of errors on the connected system, the forcible substitution process is performed in such a state that the system is working, thereby securing a high maintainability.

The errors recoverable by the ECC circuit 7 are detected. The counter 14 counts up a predetermined number of recoverable errors. In this case, the block including that address is duplicated in the separate free region. At the same time, the contents of the defect address memory 9 and the defective bit memory 10 are updated together. Even when the recoverable errors are developed into irrecoverable errors, it is feasible to avoid the access of the defect address or bits for that reason.

After turning ON the power supply at the next time, the access command of the same block is received. At this moment, the content of the defect address memory 9 or the defective bit memory 10 has been updated. The address of the substitute destination is therefore automatically accessed, thereby saving time.

The external dimensions and others are the same as those of the conventional product, and hence the system is easy to employ.

The information processing systems can be constructed in a wider range by connections to the host computers, so that a broader usability can be obtained.

Alternating is effected corresponding to collective states of defects. The number of bits which have no defect but are, though normal, unused, can therefore be kept small.

An inexpensive semiconductor storage system having a large capacity can be provided by relieving the deteriorated chips containing the defective bits.

Although the illustrative embodiment of the present invention has been described in detail with reference to the accompanying drawings, it is to be understood that the present invention is not limited to this embodiment. Various changes of modifications may be effected therein by skilled in the art without departing from the scope or spirit of the invention.

What is claimed is:

1. A semiconductor storage system comprising:
(a) a semiconductor storage element array including a plurality of semiconductor memory elements having a possibility of containing defective bits, for storing information;
(b) a data bus, having a plurality of bits, for transferring data to said semiconductor storage element array;
(c) an address bus, having a plurality of bits, for providing an address to said semiconductor storage element array;
(d) a read/write controller for controlling reading of data from and writing of data to said semiconductor storage element array;
(e) an interface control module for controlling transfer of data and commands to and receipt of data and commands from an outside system;
(f) a microprocessor for controlling said read/write controller and said interface control module;
(g) a defect address memory for storing defective addresses of said semiconductor storage element array where said defective bits have been detected and substitute addresses to be correspondingly substituted for said defective address; and
(h) a defect address manipulating circuit for providing said corresponding substitute address from said defective address memory to said semiconductor storage element array when said defective address is accessed through said address bus.

2. A semiconductor storage system comprising:
(a) a semiconductor storage element array including a plurality of semiconductor memory elements having a possibility of containing defective bits, for storing information;
(b) a data bus, having a plurality of bits, for transferring data to said semiconductor storage element array;
(c) an address bus, having a plurality of bits, for providing an address to said semiconductor storage element array;
(d) a read/write controller for controlling reading of data from and writing of data to said semiconductor storage element array;
(e) an interface control module for controlling transfer of data and commands to and receipt of data and commands from an outside system;
(f) a microprocessor for controlling said read/write controller and said interface control module;
(g) a defective bit memory for storing a position of a defective bit, where said defective bit has been detected within an address of said semiconductor storage element array;
(h) a defect alternate semiconductor storage element for providing alternate storage for said defective bit; and
(i) a defective data manipulating circuit for replacing reads and writes of said defective bit with reads and writes of said defect alternate semiconductor storage element in accordance with said position stored in said defective bit memory.

3. A semiconductor storage system comprising:
a semiconductor storage element array including a plurality of semiconductor memory elements, said plurality of semiconductor memory elements containing one or more defective bits, said array for storing information at addresses, each of which includes a plurality of bits;
a data bus, having a plurality of bits, for transferring data to and from said semiconductor storage element array;
a DRAM controller for controlling read of data from said semiconductor storage element array and write of data to said semiconductor storage element array;

a DMA controller for controlling a data transfer by giving a start command to said DRAM controller and by giving an address for one of a reading and a writing operation to said semiconductor storage element array;

an address bus, having a plurality of bits, for transferring said address to said semiconductor storage element array from said DMA controller;

an interface control module for controlling communication of the data and commands with a host computer through a magnetic disk interface;

an ECC circuit including means for reading the data transferred from said semiconductor storage element array, means for detecting an error of data, means for correcting said error and means for inputting the data to said data bus, and further including means for generating ECC data (Error Checking and Correction code data) from the data transferred from said host computer and means for transferring data including ECC data to said semiconductor storage element array from said data bus;

a microprocessor for controlling said DMA controller and said interface control module;

a defect address memory for storing defective addresses of said semiconductor storage element array where said defective bits have been detected and substitute addresses to be correspondingly substituted for said defective address; and a defect address manipulating circuit for providing said corresponding substitute address from said defective address memory to said semiconductor storage element array when said defective address is accessed through said address bus.

4. A semiconductor storage system comprising:

a semiconductor storage element array including a plurality of semiconductor memory elements, said plurality of semiconductor memory elements containing one or more defective bits, said array for storing information at addresses, each of which includes a plurality of bits;

a data bus, having a plurality of bits, for transferring data to and from said semiconductor storage element array;

a DRAM controller for controlling read of data from said semiconductor storage element array and write of data to said semiconductor storage element array;

a DMA controller for controlling a data transfer by giving a start command to said DRAM controller and by giving an address for one of a reading and a writing operation to said semiconductor storage element array;

an address bus, having a plurality of bits, for transferring said address to said semiconductor storage element array from said DMA controller;

an interface control module for controlling communication of the data and commands with a host computer through a magnetic disk interface;

an ECC circuit including means for reading the data transferred from said semiconductor storage element array, means for detecting an error of data, means for correcting said error and means for inputting the data to said data bus, and further including means for generating ECC data (Error Checking and Correction code data) from the data transferred from said host computer and means for transferring data including ECC data to said semiconductor storage element array from said data bus;

a microprocessor for controlling said DMA controller and said interface control module;

a defective bit memory for storing positional information of said defective bit existing in the data to be output at said address where said defective bit exists;

a defect alternate semiconductor storage element for alternating with said defective bit; and a defective data manipulating circuit for replacing reads and writes of said defective bit with reads and writes of said defect alternate semiconductor storage element in accordance with said positional information in said defective bit memory.

5. A semiconductor storage system comprising:

a semiconductor storage element array including a plurality of semiconductor memory elements, said plurality of semiconductor memory elements containing one or more defective bits, said array for storing information at addresses, each of which includes a plurality of bits;

a data bus, having a plurality of bits, for transferring data to and from said semiconductor storage element array;

a DRAM controller for controlling read of data from said semiconductor storage element array and write of data to said semiconductor storage element array;

a DMA controller for controlling a data transfer by giving a start command to said DRAM controller and by giving an address for one of a reading and a writing operation to said semiconductor storage element array;

an address bus, having a plurality of bits, for transferring said address to said semiconductor storage element array from said DMA controller;

an interface control module for controlling communication of the data and commands with a host computer through a magnetic disk interface;

an ECC circuit including means for reading the data transferred from said semiconductor storage element array, detecting an error of data, means for correcting said error and means for inputting the data to said data bus, and further including means for generating ECC data (Error Checking and Correction code data) from the data transferred from said host computer and means for transferring data to said semiconductor storage element array;

a microprocessor for controlling said DMA controller and said interface control module;

a defective bit memory for storing positional information of said defective bit existing in the data to be output at said address where said defective bit exists;

a defect alternate semiconductor storage element for alternation with said defective bit; and a defective data manipulating circuit for replacing an output from said defective bit with an output from said defect alternate semiconductor storage element, in accordance with the positional information in said defective bit memory.

6. The semiconductor storage system as set forth in claim 3, said defect address memory comprises:
rewritable non-volatile memories;

means for writing to said defect address memory information regarding an address where a data error is detected in at least one of said ECC circuit and a comparison between the read data and write data; and means for writing said information regarding said address where said error is detected to said defective bit memory.

7. The semiconductor storage system as set forth in claim 6, wherein said defect address is detected before delivery, and the information regarding said address where said error is detected is given beforehand to said defect address memory.

8. The semiconductor storage system as set forth in claim 6, wherein when said defect address is detected during an operation, the information regarding said address where said error is detected is given to said defect address memory and additionally registered in sequence.

9. The semiconductor storage system as set forth in claim 6, wherein said system includes a counter for counting up the number of recoverable errors detected in said ECC circuit, and means for detecting when the number of said recoverable errors reaches a predetermined number of recoverable errors at the same address, whereby said address may be substituted by another address.

10. The semiconductor storage system as set forth in claim 6, wherein said system further includes a serial port connectable to a personal computer whereby the contents of said defect address memory are rewritable by commands received at the serial port.

11. The semiconductor storage system as set forth in claim 6, wherein a DRAM unit defined as a system memory expansion unit is loaded with said defect address memory having the information with respect to said defects of said semiconductor storage element array on said DRAM unit.

12. The semiconductor storage system as set forth in claim 3 wherein said DRAM unit further comprises:

means for indicating a type of said DRAM unit; an address line and unit type line each connected to said microprocessor; and onto said unit type line at an address coincident with an address number of a slot of a main unit which is specified by said microprocessor.

13. The semiconductor storage system as set forth in claim 4 or 5, wherein:

said defect bit memory comprises rewritable non-volatile memories;

means for writing to said defective bit memory information regarding a bit where a data error is detected in at least one of said ECC circuit and a comparison between the read data and the write data; and means for writing said information regarding said bit where said error is detected to said defective bit memory.

14. The semiconductor storage system as set forth in claim 13, wherein said defective bit is detected before delivery, and the positional information thereof is given before hand to said defective bit memory.

15. The semiconductor storage system as set forth in claim 13, wherein said defective bit is detected during an operation, and the positional information thereof is given to said defective bit memory and additionally registered in sequence.

16. The semiconductor storage system as set forth in claim 13, wherein said system includes a counter for counting up the number of recoverable errors detected in said ECC circuit, and means for detecting when the number of said recoverable errors reaches a predetermined number of recoverable errors at the same address, whereby said address may be substituted by another address.

17. The semiconductor storage system as set forth in claim 13, wherein said system further includes a serial port connectable to a personal computer whereby the contents of said defective bit memory are rewritable by commands received at the serial port.

18. The semiconductor storage system as set forth in claim 13, wherein a DRAM unit defined as a system memory expansion unit is loaded with said defective bit memory having the information with respect to said defects of said semiconductor storage element array on said DRAM unit.

19. The semiconductor storage system as set forth in claim 3, 4, 5, 6, 7, 8, 9, 10, 13, 14, 15, 16, or 17, wherein external dimensions, mounting dimensions, connector dimensions and a control interface are those of a conventionally used fixed disk drive.

20. A computer system including a central processing unit and a semiconductor storage system, the semiconductor storage system comprising:

a semiconductor storage element array including a plurality of semiconductor memory elements, said plurality of semiconductor memory elements containing one or more defective bits, said array for storing information at addresses, each of which includes a plurality of bits;

a data bus, having a plurality of bits, for transferring data to and from said semiconductor storage element array;

a DRAM controller for controlling read of data from said semiconductor storage element array and write of data to said semiconductor storage element array;

a DMA controller for controlling a data transfer by giving a start command to said DRAM controller and by giving an address for one of a reading and a writing operation to said semiconductor storage element array;

an address bus, having a plurality of bits, for transferring said address to said semiconductor storage element array from said DMA controller;

an interface control module for controlling communication of the data and commands with a host computer through a magnetic disk interface;

an ECC circuit including means for reading the data transferred from said semiconductor storage element array, means for detecting an error of data, means for correcting said error and means for inputting the data to said data bus, and further including means for generating ECC data (Error Checking and Correction code data) from the data transferred from said host computer and means for transferring data including ECC data to said semiconductor storage element array from said data bus;

a microprocessor for general purpose control of said DMA controller and said interface control module;

a defect address memory for storing information regarding an address where at least one defective bit exists and information regarding a substitute address to be substituted for said address, and including means for providing as an output said stored information; and a defect address manipulating circuit for substituting said substitute address with said address where said defective bit exists in accordance with an output of said defect address memory.

21. A semiconductor storage system comprising:

a semiconductor storage element array including a plurality of semiconductor memory elements having a possibility of containing at least one defective bit, for storing information;

a data bus, having a plurality of bits, for transferring data to and from said semiconductor storage element array;

an address bus, having a plurality of bits, for providing an address to said semiconductor storage element array;

a read/write controller for controlling reading of data from and writing of data to said semiconductor storage element array;

an interface control module for controlling transfer of data and commands to and receipt of data and commands from an outside system;

a microprocessor for controlling said read/write controller and said interface module;

a defective address memory for storing defective address of said semiconductor storage element array where said defective bit has been detected and information regarding a substitute address to be correspondingly substituted for said defective address; and a defective address manipulating circuit interposed in said address bus, for providing the corresponding substitute address from said defective address memory to said semiconductor storage element array when said defect address is accessed through said address bus.

22. A semiconductor storage system according to claim 21, wherein said semiconductor storage element array is comprised of a DRAM, and said read/write controller comprises a DRAM controller for controlling a timing of reading data from and writing data to said semiconductor storage element array and a DMA controller for providing a start command to said DRAM controller and said address to said semiconductor storage element array.

23. A semiconductor storage system according to claim 21, further comprising:

a defective bit memory for storing position information of said defective bit within said defective address;

an alternative semiconductor storage element for providing alternative storage of data for said defective bit;

a defective data manipulating circuit interposed in said data bus, for providing the corresponding data from said alternative semiconductor storage element instead of the data from said semiconductor storage element array to said data bus when said defective address is accessed through said address bus.

24. A semiconductor storage system according to claim 23, wherein said defective address manipulating circuit and said defective data manipulating circuit selectively operate in accordance with defective types in said semiconductor storage element array.

25. A semiconductor storage system according to claim 23, further comprising a ECC circuit for creating ECC data in response to the data to be written from said outside system to said semiconductor storage element array and for checking and correcting an error of the data read out from said semiconductor storage element array.

26. A semiconductor storage system according to claim 25, further comprising a counter for counting the number of recoverable (correctable) errors detected in said ECC circuit, and means for detecting when the number of said recoverable errors at the same address reaches a predetermined number, whereby said address may be substituted with another address by said microprocessor.

27. A semiconductor storage system according to claim 23, wherein said defective address and bit memories are comprised of rewritable non-volatile memories, and when said error is detected at said ECC circuit, the position information of the address and the bit of said address, the data from which includes said error, are written as said defective address and said defective bit in said defective address and bit memories respectively.

28. A semiconductor storage system according to claim 23, wherein said defective address and said defective bit are detected before delivery of said system and during initialize operations of said system, and these are written in said defective address and bit memories respectively.

29. A semiconductor storage system according to claim 28, wherein said defective address and said defective bit are detected by writing a test pattern to said semiconductor storage element array, reading the written test pattern therefrom and comparing them.

30. A semiconductor storage system comprising:

a semiconductor storage element array including a plurality of semiconductor memory elements having a possibility of containing at least one defective bit, for storing information;

a data bus having a plurality of bits, for transferring data to and from said semiconductor storage element array;

an address bus having a plurality of bits, for providing an address to said semiconductor storage element array;

a read/write controller for controlling of reading of data from and writing of data to said semiconductor storage element array;

an interface control module for controlling transfer of data and commands to and receipt of data and commands from an outside system;

a microprocessor for controlling said read/write controller and said interface module;

a defective bit memory for storing position information of said defective bit within a defective address;

an alternative semiconductor storage element for providing alternative storage of data for said defective bit; and a defective data manipulating circuit interposed in said data bus, for providing the corresponding data from said alternative semiconductor storage element instead of the data from said semiconductor storage element array to said data bus when said defective address is accessed through said address bus.

* * * * *

UNITED STATES PATENT AND TRADEMARK OFFICE
CERTIFICATE OF CORRECTION

PATENT NO. : 5,357,473

DATED : October 18, 1994

INVENTOR(S) : Masahiro Mizuno; Takashi Fujita; Hiroshi Baba and Keizo Hama

It is certified that error appears in the above-identified patent and that said Letters Patent is hereby corrected as shown below:

On the title page:
At section [30] Foreign Application Priority Data please change "Sep. 8, 1990 [JP]" to read -- August 9, 1990 --

Signed and Sealed this

Seventh Day of February, 1995

Attest:

BRUCE LEHMAN

*Attesting Officer*

*Commissioner of Patents and Trademarks*